US008724049B2

(12) United States Patent
Jeong (10) Patent No.: US 8,724,049 B2
(45) Date of Patent: May 13, 2014

(54) BACKLIGHT UNIT AND LIQUID CRYSTAL DISPLAY HAVING THE SAME

(75) Inventor: Kwang-Jin Jeong, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 278 days.

(21) Appl. No.: 12/901,360

(22) Filed: Oct. 8, 2010

(65) Prior Publication Data

US 2011/0170034 A1 Jul. 14, 2011

(30) Foreign Application Priority Data

Jan. 8, 2010 (KR) .................. 10-2010-0001942

(51) Int. Cl.
*G02F 1/1333* (2006.01)
*G02F 1/1335* (2006.01)

(52) U.S. Cl.
USPC .................................. 349/60; 349/58; 349/65

(58) Field of Classification Search
USPC .................................................... 349/58–67
See application file for complete search history.

(56) References Cited

U.S. PATENT DOCUMENTS

| 7,515,220 | B2 * | 4/2009 | Ko et al. ................ 349/58 |
| 8,164,704 | B2 * | 4/2012 | Kim et al. .............. 349/58 |
| 2010/0165233 | A1 * | 7/2010 | Jung .................... 349/58 |
| 2011/0025942 | A1 * | 2/2011 | Lee ..................... 349/58 |

* cited by examiner

*Primary Examiner* — Dung Nguyen
(74) *Attorney, Agent, or Firm* — Innovation Counsel LLP (57) ABSTRACT

Provided is a backlight unit within a liquid crystal display (LCD) device where the backlight unit includes one or more light-emitting diodes (LEDs) mounted on a printed circuit board (PCB). Positioning of the PCB and its LEDs is provided by a PCB fixing member which includes a base portion and a support portion extending upward from a surface of the base portion. The PCB fixing member is structured to transfer heat energy away from the PCB and to an attached portion of the LCD device such as to a lower housing which houses the PCB and the PCB fixing member. The PCB fixing member includes a press-fit insertion groove into which at least part of the PCB can be easily inserted, thus simplifying manufacturing while assuring appropriate heat dissipation.

19 Claims, 10 Drawing Sheets

BACKLIGHT UNIT AND LIQUID CRYSTAL DISPLAY HAVING THE SAME

This application claims priority from Korean Patent Application No. 10-2010-0001942 filed on Jan. 8, 2010 in the Korean Intellectual Property Office, the disclosure of which application is incorporated herein by reference in its entirety.

BACKGROUND

1. Field of Disclosure

The present disclosure of invention relates to a backlight unit and a liquid crystal display (LCD) having the same.

2. Description of Related Technology

Liquid crystal displays (LCDs) have a wide range of applications due to their typical features, namely, lightweight and slim design, low power consumption, full-color, and high resolution. Currently, LCDs are used in computers, notebooks, personal digital assistants (PDAs), telephones, televisions, audio/video equipment, and the like. An LCD device generally displays a desired image on an LCD panel by controlling the amount of transmitted light according to image signals which are used to control a plurality of pixel units by controlling a corresponding plurality of pixel control elements arranged in a matrix form.

Since LCDs cannot emit light by themselves, they require a light source such as a backlight. Backlights used in LCDs may be classified into edge-type backlights and direct-type backlights according to the position of a light source which emits the backlighting light.

In edge-type backlights, one or more light sources are installed at one or more edges of an LCD panel, and light emitted from the light sources is delivered to the LCD panel via a transparent light guide plate (LGP) disposed under the LCD panel. Edge-type backlights can provide very uniform light, can have a long useful life, and are advantageous for making LCDs slimmer. On the other hand, in direct-type backlights, a plurality of light sources are disposed under an LCD panel and they irradiate light directly to the entire surface of the LCD panel rather than relying on a LGP to redirect light to the back face of the LCD panel. Direct-type backlights can thus ensure high luminance.

Until recently, cold cathode fluorescent lamps (CCFLs) have been generally used as light sources for LCD panels. However, research is being actively conducted to replace CCFLs with light-emitting diodes (LEDs) which have a long useful life, low power consumption, and a lightweight and slim design.

SUMMARY

One drawback of LEDs is that they tend to give off more heat than conventional fluorescent lamps. The heat given off from the LEDs can raise the temperature inside a backlight assembly excessively and thereby degrade the reliability of electronic circuits and the like also housed in the LCD device assembly. In addition, the temperature difference inside an LCD device housing causes thermal stress on parts or casings, resulting in deformation of the parts or the casings.

In accordance with one aspect of the present disclosure, there is provided a backlight unit having an assembly structure which can efficiently dissipate heat generated from a plurality of light-emitting diodes (LEDs) while also allowing a PCB supporting the LEDs to be press-inserted into place during manufacture.

However, aspects of the present disclosure are not restricted to the exemplary ones set forth herein. The above and other aspects of the present disclosure will become more apparent to one of ordinary skill in the art to which the present disclosure pertains by referencing the detailed description as given below.

According to one detailed an aspect of the present disclosure, there is provided a backlight unit including: one or more LEDs which emit light; a printed circuit board (PCB) on which the LEDs are installed where the PCB has a first heat conducting material configured to transfer heat energy away from the LEDs; a PCB fixing member which is configured to fix the PCB into place, where the PCB fixing member has a second heat conducting material configured to thermally couple with the first heat conducting material and to thereby continue the transfer of heat energy away from the LEDs, where the PCB fixing member includes a base portion and a support portion extending upward from a surface of the base portion; and a lower housing which houses the PCB and the fixing member, wherein the PCB fixing member includes an insertion receiving structure configured to receive at least part of the PCB in a closely-fit insertion manner.

According to another aspect of the present disclosure, there is provided an LCD device including: a backlight unit including one or more LEDs which emit light, a PCB on which the LEDs are installed, a fixing member which includes a base portion and a support portion extending upward from a surface of the base portion, and a lower housing which houses the PCB and the fixing member; an LCD panel which displays an image using light received from the backlight assembly; and an upper housing which is coupled to the lower housing and fixes the LCD panel in place, wherein the fixing member includes an insertion receiving structure into which at least part of the PCB is inserted.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Advantages and features of the here disclosed apparatus and methods may be understood more readily by reference to the following detailed description of exemplary embodiments and the accompanying drawings. The present teachings may, however, be embodied in many different forms and should not be construed as being limited to the exemplary embodiments set forth herein. Rather, these embodiments are provided so that this disclosure will be thorough and complete and will fully convey the concepts of the present teachings to those skilled in the pertinent art. In some embodiments, well-known processes, structures, and technologies will not be specifically described in order to avoid excessive and mundane detail. Like reference numerals refer to like elements throughout the specification.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

The terminology used herein is for the purpose of describing particular embodiments only and is not intended to be limiting of the teachings. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the pertinent art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
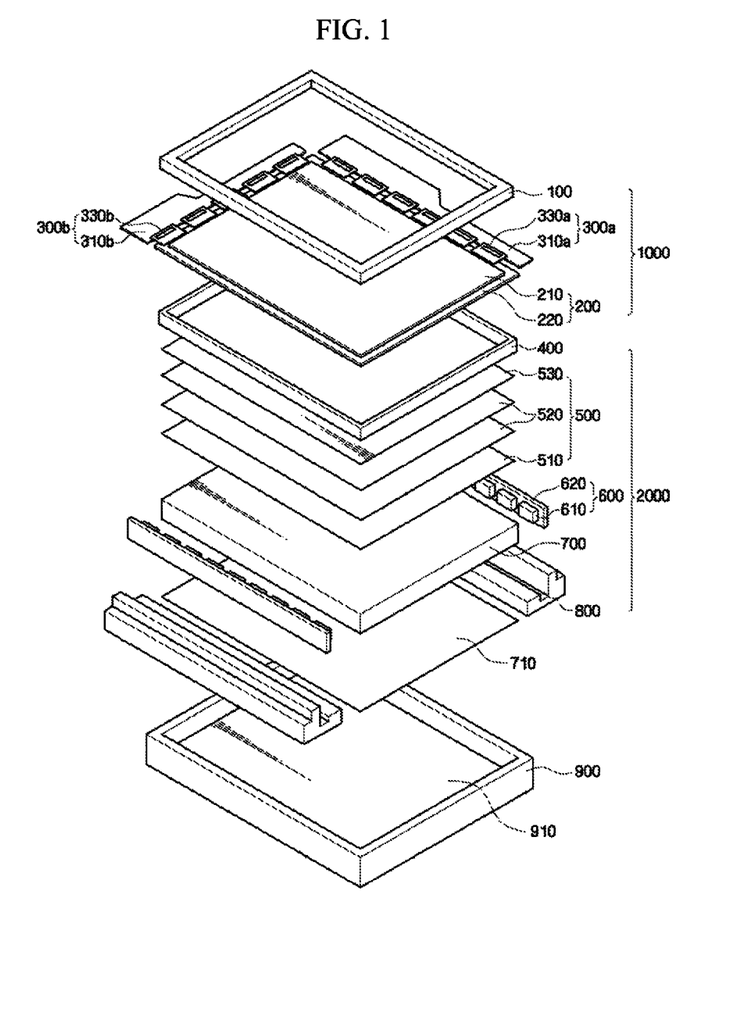
FIG. 1 is an exploded perspective view of a liquid crystal display (LCD) according to an exemplary embodiment.
Figure 2:
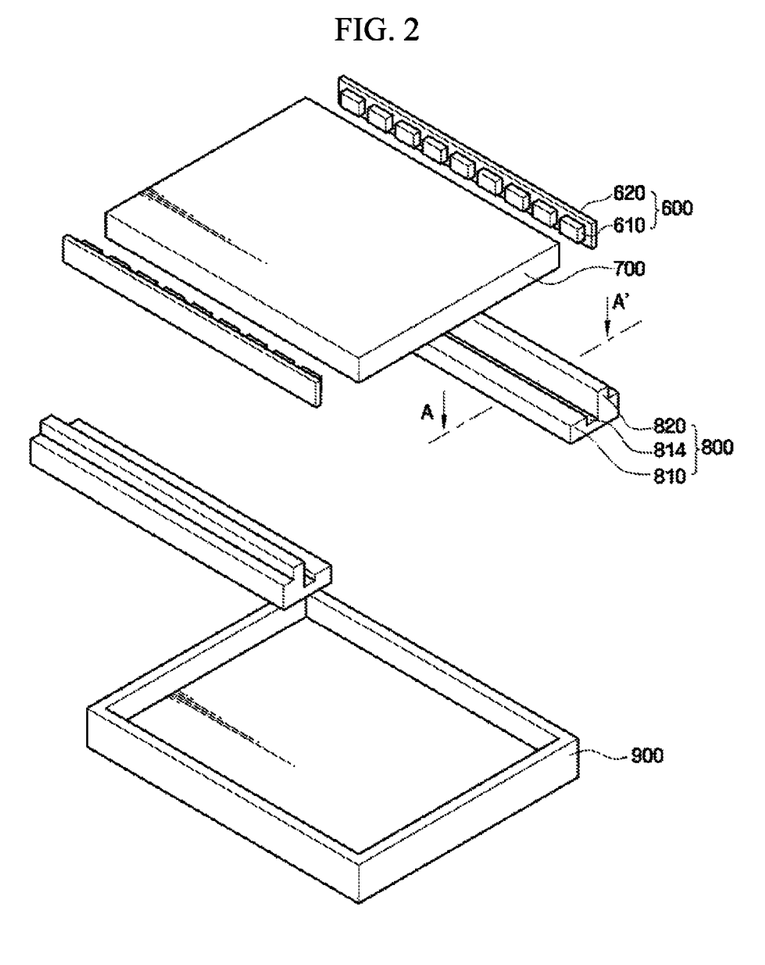
FIG. 2 is an exploded perspective view selectively showing a backlight unit of FIG. 1.
Figure 3:
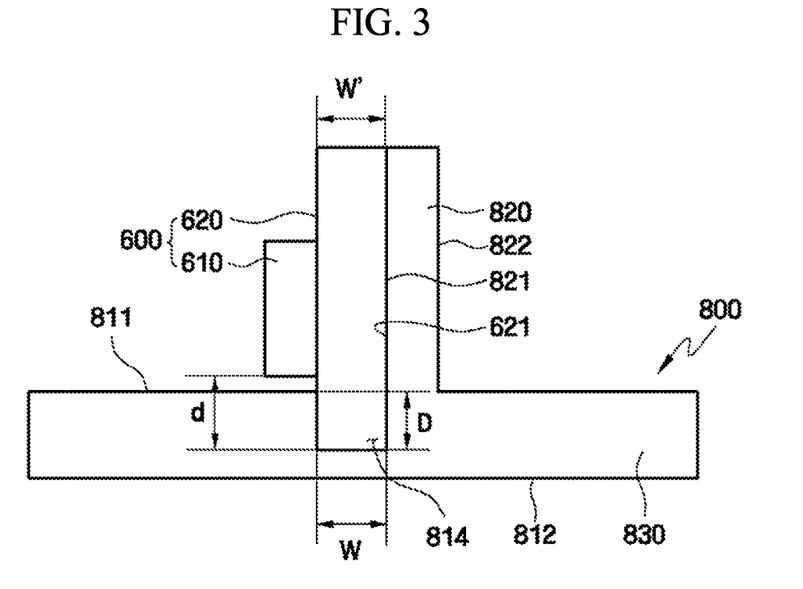
FIG. 3 is a cross-sectional view of a fixing member taken along the line A-A' of FIG. 2.

FIG. 1 is an exploded perspective view of a liquid crystal display (LCD) device according to a first exemplary embodiment. FIG. 2 is an exploded perspective view selectively showing a backlight unit 2000 of FIG. 1. FIG. 3 is a cross-sectional view of a fixing member taken along the line A-A' of FIG. 2.

Referring to FIGS. 1 through 3, the LCD device according to the current exemplary embodiment includes a display assembly 1000 and the backlight unit 2000 disposed behind the display assembly 1000.

The display assembly 1000 includes an LCD panel 200, a set of driving circuit units 300a and 300b, and an upper housing 100.

The LCD panel 200 includes a color filter substrate 210 and a thin-film transistor (TFT) substrate 220. The color filter substrate 210 includes different colored filters such as red, green and blue light filters formed by a thin-film process. The red, green and blue filters contribute to forming color pixels, each displaying a predetermined color as light of controlled luminance passes therethrough.

The TFT substrate 220 may be a transparent glass substrate having TFTs arranged in a matrix form. Specifically, a data line is connected to a source terminal of each of the TFTs, and a gate line is connected to a gate terminal thereof. In addition, a pixel electrode, which is composed of a transparent conductive material (e.g., ITO), is formed in a light passing aperture region of the pixel and is connected to drain terminal of its respective TFT. When a row selecting electrical signal is input to the gate line, each of the TFTs in the row is turned on. Image defining data signals on the data lines of the row are then charged onto the pixel-electrodes. When a given pixel-electrode is charged relative to a common electrode, an electric field is formed between the pixel electrode and a common electrode of the color filter substrate 210. The electric field changes the alignment of liquid crystal molecules interposed between the TFT substrate 220 and the color filter substrate 210, which, in turn, changes the amount of transmittance of light. As a result, a desired image is obtained.

The driving circuit unit is connected to the LCD panel 200 and includes a data-side printed circuit board (PCB) 310a, a gate-side PCB 310b, data-side flexible PCBs 330a, and gate-side flexible PCBs 330b. The data-side PCB 310a has control integrated circuits (ICs) and transmits data signals to data lines of the TFT substrate 220. The gate-side PCB 310b has control ICs and transmits gate signals to gate lines of the TFT substrate 220. The data-side flexible PCBs 330a have exposed ground patterns and connect the TFT substrate 220 and the data-side PCB 310a. The gate-side flexible PCBs 330b have exposed ground patterns and connect the TFT substrate 220 and the gate-side PCB 310b.

The data-side PCB 310a and the gate-side PCB 310b are connected respectively to the data-side flexible PCBs 330a and the gate-side flexible PCBs 330b to transmit external image signals and external gate-driving signals. The data-side PCB 310a and the gate-side PCB 310b may alternatively be integrated into one PCB which is then connected to a side of the LCD panel 200. To this end, each data line and each gate line of the TFT substrate 220 may be exposed through an interface provided at one side of the TFT substrate 220.

The data-side flexible PCBs 330a and the gate-side flexible PCBs 330b are connected respectively to the data lines and the gate lines of the TFT substrate 220 to transmit a respective data-driving signal and a gate-driving signal to each TFT. In addition, the data-side flexible PCBs 330a and the gate-side flexible PCBs 330b have tape automated bonding (TAB) ICs and transmit various signals generated from the data-side PCB 310a and the gate-side PCB 310b to the LCD panel 200. Here, examples of the various signals that may be transmitted include digital red, green and blue (RGB) brightness value signals, a shift start clock (SSC) signal, a latch pulse (LP) signal, a gamma analog ground signal, a digital ground signal, digital power, an analog power common voltage, and an accumulated voltage. The TFT substrate 220 may have ICs mounted thereon and/or may have electronic circuitry integrally formed thereon.

The data-side PCB 310a and the gate-side PCB 310b may also be integrated into one PCB, and the numbers of the data-side flexible PCBs 330a and the gate-side flexible PCBs 330b may be reduced. To this end, wiring may be formed on the TFT substrate 220, or driver IC chips may be mounted on the TFT substrate 220.

The upper housing 100 may be manufactured in the form of a square frame having a flat portion and side surfaces which extend from the flat portion in a direction perpendicular to the flat portion. Accordingly, the upper housing 100 can prevent components of the display assembly 1000 from moving out of place and protect the LCD panel 200 or the backlight unit 2000 which can be easily broken by external impact. The upper housing 100 may protectively cover all of the backlight unit 2000 and the LCD panel 200 as shown in FIG. 1 or may cover only part of the backlight unit 2000 (not shown).

The backlight assembly 2000 may include a pair of light source units 600, a light guide plate (LGP) 700 which is disposed adjacent to the light source units 600, a reflective sheet 710 which is disposed under the LGP 700, a plurality of optical sheets 500 which are installed on the LGP 700, a lower housing 900 which houses the reflective sheet 710, the LGP 700 and the optical sheets 500, a middle mold piece 400 which is coupled to the lower housing 900 to fix the reflective sheet 710, the LGP 700 and the optical sheets 500 in place, and a pair of fixing members 800. The LGP 700 and the optical sheets 500 deliver light generated from the light source units 600 to an external destination in the form of diffuse light. Each of the fixing members 800 contacts a PCB 620 of a corresponding one of the light source units 600.

Each of the light source units 600 includes a plurality of light-emitting diodes (LEDs) 610 and the PCB 620 on which the LEDs 610 are mounted. The LEDs 610 may be LEDs that emit white light or may be an LED package that consists of red, green and blue LEDs. Electrical or other terminals of the LEDs 610 may include a heat transfer material such as aluminum or copper for transferring heat out of the interior of the LEDs. The PCB 620 has a mating, first heat conducting material configured to couple (conduct) heat generated from the LEDs 610 away from the LEDs and to a respective one or more of the PCB fixing members 800. The PCB 620 also applies electrical power for example in the form a predetermined voltage or current to the LEDs 610 mounted thereon. In addition, predetermined grooves may be formed in the PCB 620, and the LEDs 610 may be mounted in the grooves. That is, an inner surface of the PCB 620 may have reflective regions which respectively envelope the LEDs 610. Thus, the efficiency of light use can be maximized. The LEDs 610 may be arranged on a surface of the PCB 620 in a predetermined direction, for example, in a direction substantially parallel to a long side of the PCB 620. Here, a light-emitting portion of each of the LEDs 610 may be disposed adjacent to the LGP 700. That is, the center of the light-emitting portion may be located at substantially the same position as the center of the LGP 700. Accordingly, light emitted from the light-emitting portion can be input to the LGP 700 with little loss of light.

In the current exemplary embodiment, a pair of light source units 600 are respectively disposed on inner side surfaces of the lower housing 900 which oppose each other. However, in an alternate embodiment, one or more light source units 600 may also be disposed on only one side surface of the lower housing 900 or may also be disposed on four side surfaces of the lower housing 900. Here, the light source units 600 may be formed by coupling a plurality of PCBs in the direction of a long side of the PCB to form one side surface of the lower housing 900. The disposition of the light source units 600 in the lower housing 900 may vary according to the size of LCD device and the type of product to which the LCD device is applied (such as mobile phones, monitors, notebooks, and televisions).

Referring to FIG. 2, each of the PCB fixing members 800 includes a base portion 810 and a support portion 820 which extends from a surface (an upper surface 811) of the base portion 810. The support portion 820 may extend from the upper surface 811 of the base portion 810 at a predetermined angle other than zero. In the exemplary embodiment of FIG. 3, the support portion 820 extends from the upper surface 811 of the base portion 810 in a direction perpendicular to the upper surface 811.

Referring to FIG. 3, the support portion 820 of the illustrated fixing member 800 includes a first side surface 821 and an opposed second side surface 822. The first side surface 821 of the support portion 820 contacts the PCB 620, and the second side surface 822 of the support portion 820 contacts the middle mold piece 400 (not shown). A lower surface 812 of the base portion 810 of each of the fixing members 800 contacts the lower housing 900.

An insertion groove 814, which is an insertion receiving structure shaped and dimensioned for receiving a corresponding light source unit 600, is formed in the upper surface 811 of the base portion 810. In some embodiments, at least one of inner surfaces of the insertion groove 814 may be located in the same plane as, and thus serve as an extension of the first side surface 821 of the support portion 820. That is, the insertion groove 814 may be formed along the first side surface 821 of the support portion 820.

In one embodiment, a maximum depth D of the insertion groove 814 from the upper surface 811 of the base portion 810 is constrained to be smaller than or equal to a distance d between a lower end of each of the LEDs 610 on the PCB 610 and a lower end of the PCB 620. The depth D of the insertion groove 814 may be adjusted such that the center of the LEDs 610 in a widthwise direction of the LEDs 610 can substantially match the center (not shown) of a light inputting area of the LGP 700 in a thicknesswise direction of the LGP 700 when a rear surface 621 of the PCB 620 is tightly fixed to (e.g., pressed into good thermal contact with) a heat conducting surface of the support portion 820 of each of the fixing members 800, for example, the first side surface 821 by inserting at least part of the PCB 620, for example, an end of the PCB 620 into the insertion groove 814. While not explicitly shown, it is to be understood that that the PCB fixing members 800 each includes a second thermal energy conducting material (e.g., aluminum) that thermally couples with the first thermal energy conducting material of the PCB and also with a third thermal energy conducting material of for example, the lower housing 900 so that the PCB fixing members 800 can act as efficient heat transfer intermediates for transferring heat energy away from the LEDs and towards the ambient (e.g., air surrounding the lower housing 900).

A width W of the insertion groove 814 may be determined by a thickness W' of the PCB 620. For example, the width W of the insertion groove 814 may be similar to the thickness W' of the PCB 620. To securely fix (e.g., press fit) the PCB 620 to the insertion groove 814, it may be advantageous for the width W of the insertion groove 814 to be slightly smaller than the thickness W' of the PCB 620. The width W of the insertion groove 814 may be equal to or even slightly larger than the thickness W' of the PCB 620 depending on how the PCB 620 is affixed so as to be secured by the insertion groove 814.

When the LEDs 610 of the light source units 600 are driven by electrical power so as to emit light, they also generate waste heat. The heat of the LEDs 610 is delivered to each of the fixing members 800, which is in close physical contact as well as in good thermal coupling with the rear surface 621 of the PCB 620, where the heat is coupled via the PCB 620 which is in physical contact with the LEDs 610 as well as in good thermal coupling with the LEDs 610. Then, the heat delivered to each of the fixing members 800 is dissipated to the middle mold piece 400 which contacts the second side surface 822 of each of the fixing members 800 and dissipated to the lower housing 900 which contacts the lower surface 812 of the base portion 810 of each of the fixing members 800. The heat delivered to the middle mold 400 may thereafter be delivered to the lower housing 900 which also contacts the middle mold 400. Needless to say, the lower housing 900 and middle mold piece 400 each includes a good thermal conducting material (e.g., aluminum) which allows for relatively good transfer of heat away from the PCB fixing members 80 and dissipation of the removed heat to the ambient. That is, heat generated by the LEDs 610 of each of the light source units 600 as the LEDs 610 emit light may be delivered to the PCB 620 which is in contact with the LEDs 610, and the heat delivered to the PCB 620 may be delivered to the middle mold 400 and the lower housing 900 via each of the PCB fixing members 800. Finally, the so-coupled heat energy may be dissipated to the ambient from the middle mold 400 and/or from the lower housing 900, thereby helping to lower housing interior temperatures of the LCD device.

In view of the above heat transfer process, the PCB fixing members 800 may be made of a material (e.g., metal) with excellent thermal conductivity, so that heat delivered to the PCB 620 from the LEDs 610 can be well conducted and evenly distributed to the middle mold 400 and to the lower housing 900 by each of the fixing members 800. The metal can be any type of appropriate metal as long as it has a relatively high thermal conductivity. For example, the metal that forms the fixing members 800 may be aluminum or an aluminum alloy that has superior thermal conductivity. One specific example of the fixing members 800 may be aluminum extruded parts. The PCB and corresponding PCB fixing members 800 are further configured so as not to impede desired electrical operation of the LEDs.

The fixing members 800 may be formed by an extrusion-molding process. That is, the extrusion-molding process may produce the fixing members 800 having shapes defined by corresponding pre-manufactured extrusion molds. In the exemplary embodiment of FIGS. 1 and 2, a pair of fixing members 800 are respectively disposed on the inner side surfaces of the lower housing 900 which oppose each other. However, one or more fixing members 800 may also be disposed on only one side surface of the lower housing 900 or may also be disposed on the four side surfaces of the lower housing 900. In some embodiments, one or more fixing members 800 may be installed to correspond respectively to one or more light source units 600 which may be disposed on one side surface, two opposite side surfaces, or four side surfaces of the lower housing 900.

In order to securely fix the PCB 620 to each of the fixing members 800, the PCB 620 may be press-fit inserted into each of the fixing members 800. However, the methods used to fix the PCB 620 to each of the fixing members 800 and to thermally inter-couple the two objects is not limited to the press-fit insertion method. The PCB 620 may also be securely fixed to each of the fixing members 800 using various methods such as screws, hooks and/or thermally conductive adhesives. Here, only one method or a combination of methods may be used to fix the PCB 620 to each of the fixing members 800. For example, predetermined grooves may be formed respectively in both ends of the PCB 620, and then the PCB 620 may be coupled to each of the fixing members 800 with screws.

The PCB 620 can be fixed to each of the fixing members 800 with only screws without the insertion of an end of the PCB 620 into the insertion groove 814 of each of the fixing members 800. In this case, however, a greater amount of time may be required to screw the PCB 620 to each of the fixing members 800 as compared to press fitting, thus deteriorating productivity. In addition, since the length of the PCB 620 increases as the size of the LCD panel 200 increases, the time required to couple the PCB 620 to each of the fixing members 800 with plural screws also increases with size, resulting in an increase in production cost. Moreover, the PCB 620 and each of the fixing members 800 may not be precisely and firmly attached to each other in regions other than regions to which screws are driven. Accordingly, a gap may be formed between the PCB 620 and each of the fixing members 800 in the regions to which screws are not driven. The gap may reduce the transfer of heat from the LEDs 610 to the PCB 620 and thus hinder the heat from being efficiently transferred and uniformly released to the lower housing 900. Ultimately, the heat that fails to be dissipated with least resistance to the outside may cause problems with the reliability of the LCD device. In the current exemplary embodiment, however, an end of the PCB 620 is press-fit-wise inserted into the insertion groove 814 of each of the fixing members 800. Thus, the formation of thermal-transfer gaps can be minimized. That is, an end of the PCB 620 inserted into the insertion groove 814 can be precisely and completely attached to each of the fixing members 800. In addition, other regions of the PCB 620, which are connected to the inserted end of the PCB 620 as a single body, can be precisely and completely attached to the support portion 820 since the position of the inserted end of the PCB 620 is fixed by the insertion groove 814. Therefore, the gap between the PCB 620 and the support portion 820 can be minimized.

Referring to FIGS. 1 and 2, the LGP 700 is placed in the lower housing 900. The LGP 700 converts light with an optical distribution in the form of a point or line light source, which is emitted from the light source units 600, into light with an optical distribution in the form of a surface light source and provides the light to the LCD panel 200. The LGP 700 may be a wedge-type plate or a parallel flat plate. In addition, the LGP 700 may be made of polymethylmethacrylate (PMMA) which is not easily deformed or broken due to its high strength and has high transmittance. The LGP 700 may be separated from each of the light source units 600 by a predetermined gap as shown in FIG. 2 or may be in contact with each of the light source units 600. Also, part of each of the light source units 600 may overlap the LGP 700.

The reflective sheet 710 may be a plate with high reflectivity and reduce light loss by reflecting light output from a rear surface of the LGP 700 toward the LGP 700. The reflective sheet 710 is installed to be in contact with a bottom surface of the lower housing 900. The reflective sheet 710 shown in FIG. 1 is flat. However, the reflective sheet 710 may alternatively be uneven. For example, the reflective sheet 710 may include a reflective surface and triangular prisms protruding from the reflective surface. The reflective sheet 710 may also be omitted by forming a material with high reflection efficiency on the bottom surface of the lower housing 900. Alternatively, the reflective sheet 710 and the lower housing 900 may be formed as a single body.

The optical sheets 500 may include a diffusion sheet 510, luminance enhancement sheets 520, and a protection sheet 530. Some of the optical sheets 500 can be omitted.

The optical sheets 500 are disposed on the LGP 700 to increase the efficiency of light output from the LGP 700 and make the luminance distribution of the light uniform. The diffusion sheet 510 directs light output from the LGP 700 to the front of the LCD panel 200 and diffuses light to have a uniform distribution over a wide area before providing the light to the LCD panel 200. The diffusion sheet 510 may be a transparent resin film having a predetermined light diffusing member coated on both surfaces thereof. The luminance enhancement sheets 520 cause light obliquely incident thereupon to be perpendicular to the LCD panel 200 when the light leaves the luminance enhancement sheets 520. This is because light efficiency increases when light enters the LCD panel 200 in a direction perpendicular to the LCD panel 200. To make light output from the luminance enhancement sheets 520 perpendicular to the LCD panel 200, one or more luminance enhancement sheets 520 may be disposed under the LCD panel 200. In the current exemplary embodiment, two luminance enhancement films 520 are used. The two luminance enhancement sheets 520 include a first luminance enhancement sheet which polarizes light output from the diffusion sheet 510 in a direction and a second luminance enhancement sheet which polarizes light in a direction perpendicular to the first luminance enhancement sheet. The protection sheet 530 prevents the luminance enhancement sheets 520 from being damaged, for example, from be scratched.

The middle mold piece 400 is coupled to the lower housing 900. Accordingly, the optical sheets 500, the LGP 700, the light source units 600, the reflective sheet 710, and the fixing members 800 are housed between the middle mold 400 and the lower housing 900. The middle mold 400 is formed along edges of the lower housing 900 and has an open window in the middle to expose the optical sheets 500 and let light pass through.

The LCD panel 200 is placed on the middle mold 400. The middle mold 400 may be made of a flexible material, such as a plastic material, in order to prevent the LCD panel 200 from be damaged.

The lower housing 900 is shaped like a rectangular box having an open top, and a housing space is formed to a predetermined depth inside the lower housing 900. The lower housing 900 includes a bottom surface 910 and side surfaces which extend respectively from edges of the bottom surface 910 in a direction perpendicular to the bottom surface 910. The light source units 600 are disposed on two opposite side surfaces or four surfaces of the lower housing 900, and each of the fixing members 800 is disposed between a corresponding one of the light source units 600 and the lower housing 900.

Figure 4:
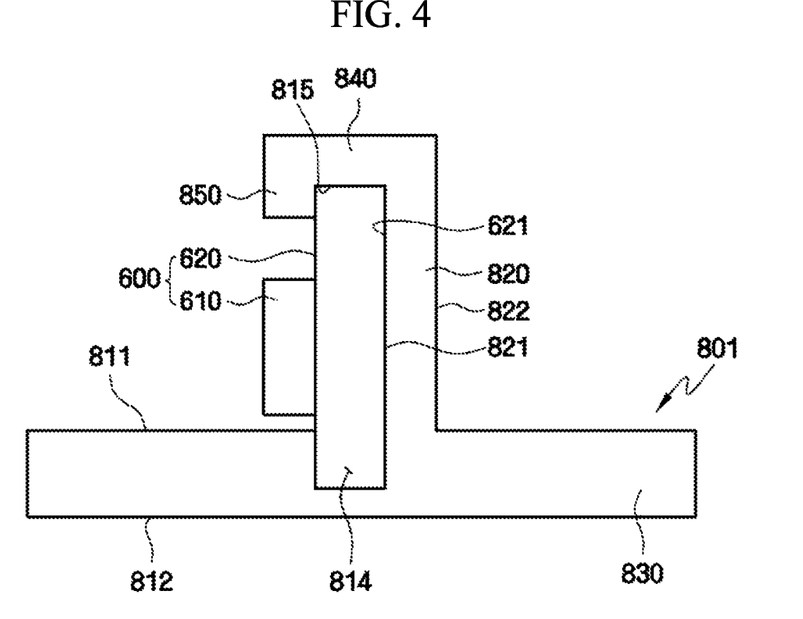
FIG. 4 is a cross-sectional view of a fixing member according to another exemplary embodiment.

Hereinafter, other exemplary embodiments in accordance with the disclosure will be described. FIG. 4 is a cross-sectional view of a second fixing member 801 according to another exemplary embodiment. Elements having the same functions and effects as those of the previous embodiment are indicated by like reference numerals, and thus a detailed description thereof will be omitted.

Referring to FIG. 4, an LCD device according to the current exemplary embodiment is different from the LCD device According to the embodiment of FIG. 3 in that the fixing member 801 includes an overhanging or cover portion 840. Specifically, the cover portion 840 bends and extends inwards, that is, toward a PCB 620 from a first end of a support portion 820. A first end of the PCB 620 is inserted into an insertion groove 814, and a second end of the PCB 620 is thereafter covered by the cover portion 840. In an alternate embodiment, the PCB 620 is slid into place by pressing it through the receiving space defined by lower groove 814 and overhang groove 815. This structure prevents the movement of the PCB 620 and allows the PCB 620 to be more effectively fixed to and thermally coupled to the fixing member 801. Thus, the PCB 620 and the fixing member 801 can be more securely attached to each other.

In some other embodiments in accordance with the disclosure, the fixing member 801 may further include a protrusion 850 which protrudes downward and overhangs from the cover portion 840. The protrusion 850, the cover portion 840, and the support portion 820 cover the second end of the PCB 620. That is, together with the cover portion 840 and the support portion 820, the protrusion 850 provides an upper housing groove or space 815 for the second end of the PCB 620. The housing space 815 may perform substantially the same function as the lower insertion groove 814. Thus, like a width of the insertion groove 814, a width of the housing space 815 may be equal to or slightly smaller than a thickness of the PCB 620. In some exemplary embodiments, the housing space 815 is designed the same way as the insertion groove 814. Since the first end of the PCB 620 can be inserted into the insertion groove 814 and the second end of the PCB 620 can be inserted into the housing space 815 due to the protrusion 850 described above, the rear surface 621 of the PCB 620 can be kept more securely attached to the support portion 820. If the PCB 620 is securely attached to the support portion 820 of the fixing member 801, heat generated from a light source unit can be dissipated in a more stable and effective manner.

Figure 5:
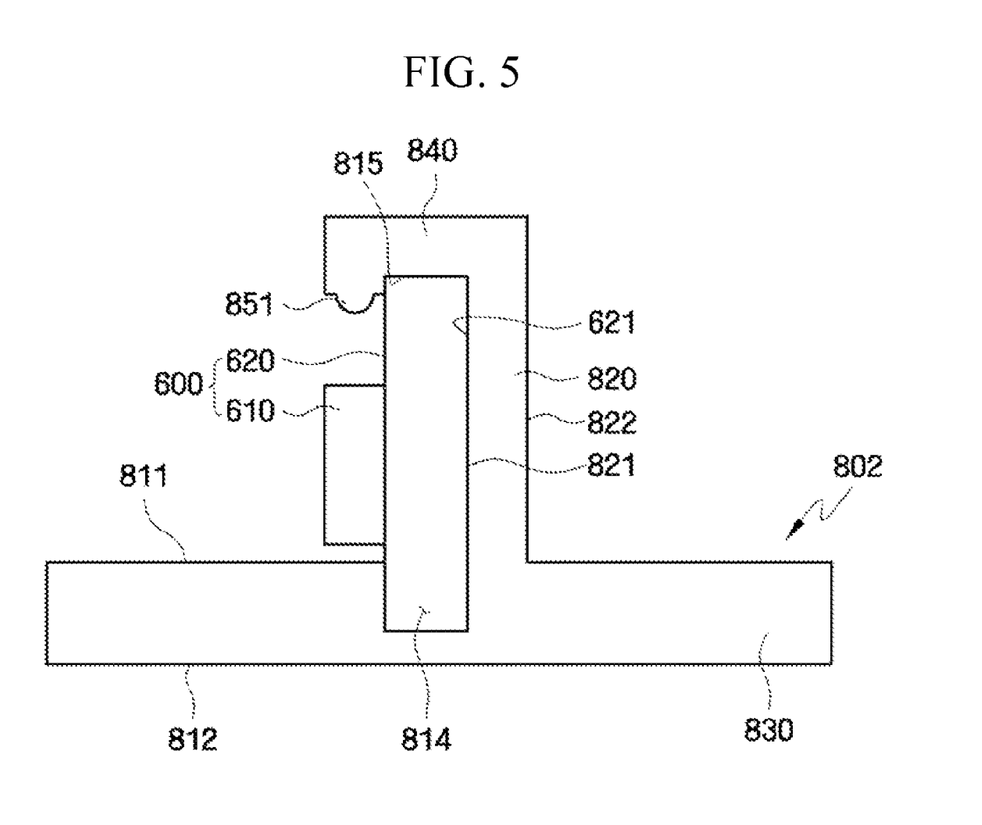
FIGS. 5 through 9 are cross-sectional views of fixing members according to other exemplary embodiments.

FIG. 5 is a cross-sectional view of a third fixing member 802 according to another exemplary embodiment. The current embodiment is substantially identical to the embodiment of FIG. 4. However, they differ in that a protrusion 851 of the fixing member 802 according to the current exemplary embodiment has a curved cross section and the overhang has spring like or otherwise resilient attributes so that PCB 620 can be spring loaded into position. Specifically, the cross section of the protrusion 851 may be semicircular or round. The protrusion 851 having a curved cross section enables an end of a PCB 620 to be smoothly inserted into an insertion groove 814 and the other end of the PCB 620 to be smoothly inserted into a housing space 815 without great resistance when spring loading is used.

Figure 6:
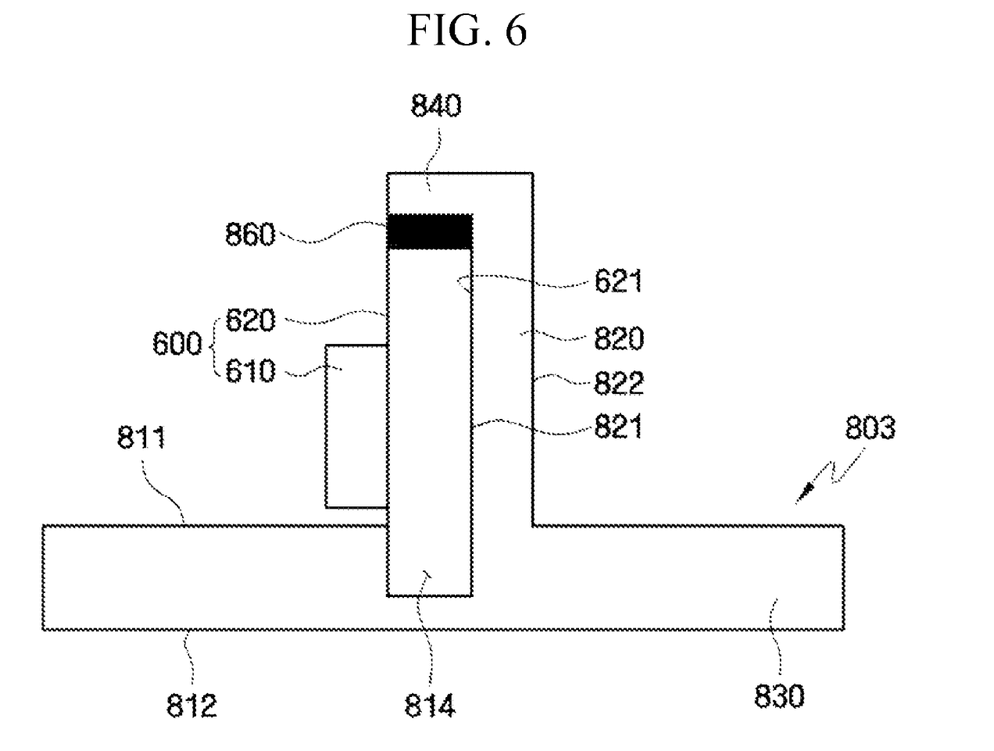

FIG. 6 is a cross-sectional view of a fourth fixing member 803 according to another exemplary embodiment. The current embodiment is substantially identical to the embodiment of FIG. 4. However, they differ in that an elastic pressurizing member 860 is formed on a lower surface (a surface facing a base portion) of a cover portion 840 of the fixing member 803. The pressurizing member 860 and the fixing member 803 may be formed as a single body. Alternatively, the pressurizing member 860 may be formed as a separate member, and a horizontal portion of the pressurizing member 860 may be attached to the lower surface of the cover portion 840. Yet alternatively, the elastic pressurizing member 860 may be formed as an integral part of the PCB 620.

When the pressurizing member 860 and the fixing member 803 are formed as a single body, the pressurizing member 860 may bend and extend from a horizontal portion of the fixing member 803 at an angle of 180 degrees with respect to the horizontal portion.

When the pressurizing member 860 is formed separate from the fixing member 803, it may be formed using an elastic member. Examples of the elastic member include a spring, a leaf spring, a rubber, a sponge, and a substantially elastic plastic. However, the elastic member is not limited to the above examples. Any member having resilient properties can be used. When the pressurizing member 860 is formed separate from the fixing member 803, it may also be formed using a member having heat dissipation properties as well as elastic properties. The pressurizing member 860 formed as a separate member may be attached to the lower surface of the cover portion 840 using an adhesive or other attaching members.

The pressurizing member 860 is compressed when an end of the PCB 620 is inserted into an insertion groove 814, thereby facilitating the insertion of the end of the PCB 620 into the insertion groove 814. After the end of the PCB 620 is inserted into the insertion groove 814, the pressurizing member 860 is released to expand again due to its elastic restoring force. As the pressurizing member 860 expands, it applies pressure onto the other end of the PCB 620, thereby attaching the PCB 620 to the fixing member 803 as closely as possible. Accordingly, regardless of design and assembly errors of the PCB 620, the PCB 620 can be effectively prevented from failing to be firmly attached to a support portion 820 of the fixing member 803 and thus moving out of place.

Figure 7:
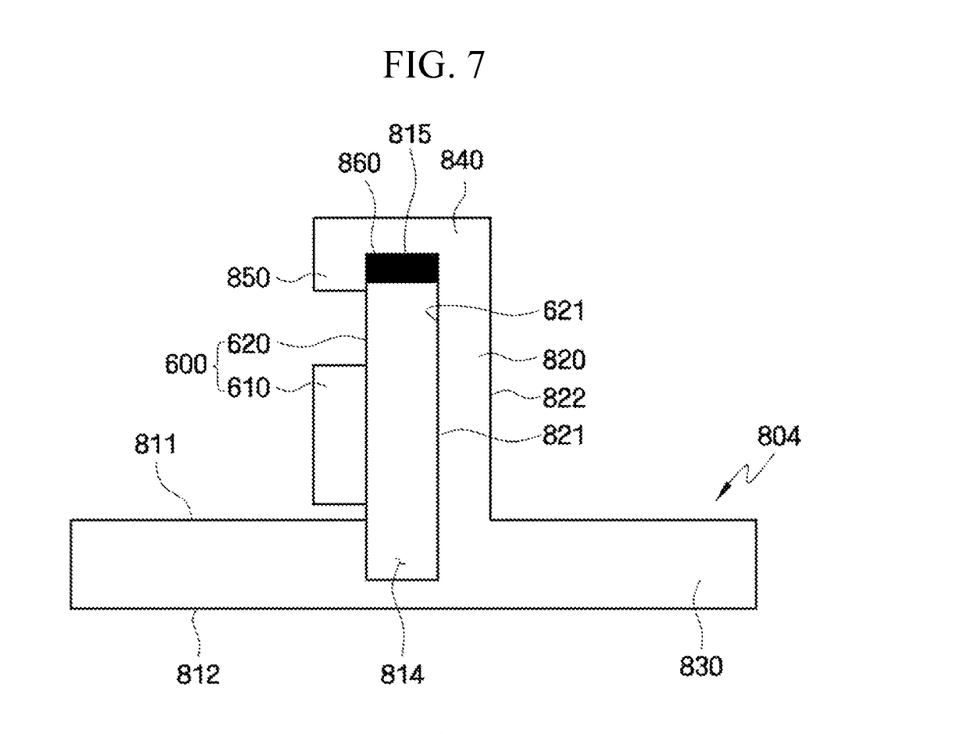

FIG. 7 is a cross-sectional view of a fifth fixing member 804 according to another exemplary embodiment. The current embodiment is different from the embodiment of FIG. 6 in that a fixing member 804 further includes a protrusion 850 protruding downward from a cover portion 840. As described above in the embodiment of FIG. 4, a housing space 815 is created by the formation of the protrusion 850. In FIG. 7, a pressurizing member 860 is shorter than the protrusion 850. Thus, the pressurizing member 860 is completely accommodated in the housing space 815. However, unlike the illustration in FIG. 7, the pressurizing member 860 may also be taller than the protrusion 850. In this case, a lower surface of the pressurizing member 860 may be lower than a lower end of the protrusion 850.

Figure 8:
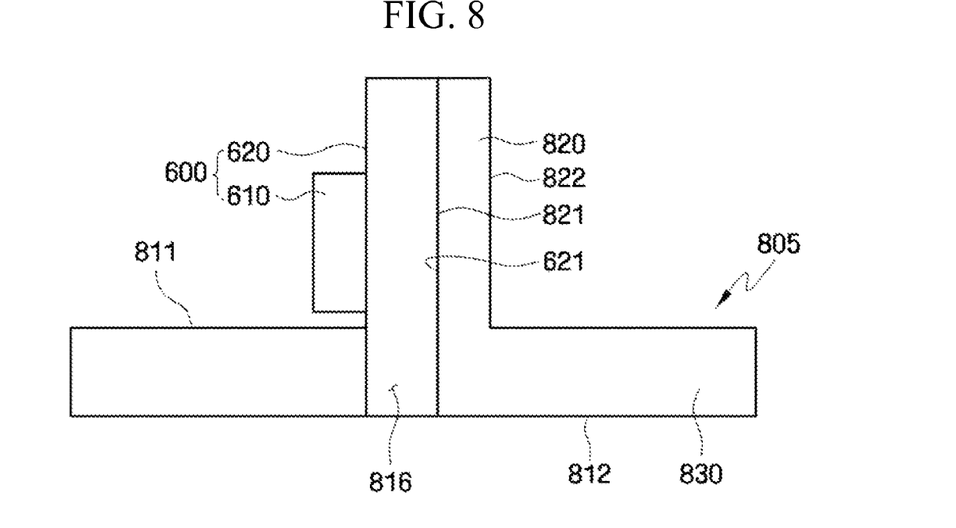
Figure 9:
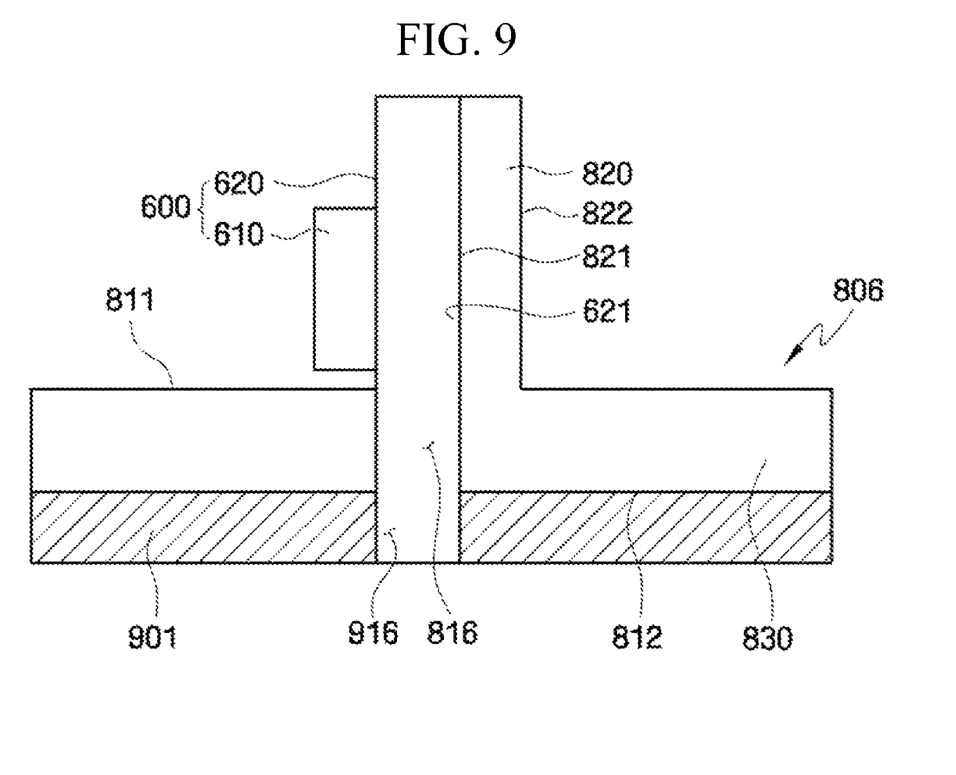

FIGS. 8 and 9 are respectively cross-sectional views of sixth and seventh fixing members 805 and 806 according to other exemplary embodiments.

Referring to FIG. 8, an insertion groove 816 of the fixing member 805 according to some embodiments may have an open bottom. In this case, an end of a PCB 620 may be inserted into the insertion groove 816 to a depth equal to or lower than a lower surface of a base portion 830. Accordingly, the area of a region of the PCB 620, which contacts the base portion 830, may increase, thus contributing to more effective heat dissipation. Furthermore, since a region of the PCB 620 which is physically inserted and fixed to the open-bottom insertion groove 816 is larger than that of the PCB 620 according to the embodiment of FIG. 4, the other regions of the PCB 620 which are not inserted into the insertion groove 816 can be more easily and securely attached to the support portion 820.

In some other embodiments, the bottom of the insertion groove 816 may include a combination of open regions and closed regions along the base portion 830.

Referring to FIG. 9, in some embodiments, an insertion groove 816 of the fixing member 806 may have an open bottom, and a lower housing 901 disposed under the fixing member 806 may include a hole 916 which is connected to the insertion groove 816. In this case, an end of a PCB 620 may be inserted into the insertion groove 816 and the hole 916 to a depth equal to a lower surface of the lower housing 901. Accordingly, the area of a region of the PCB 620, which contacts a base portion 830 and the lower housing 901, may increase, thus contributing to more effective heat dissipation. Furthermore, since a larger region of the PCB 620 is physically inserted and fixed to the insertion groove 816, the PCB 620 can be more easily and securely attached to the support portion 820.

Figure 10:
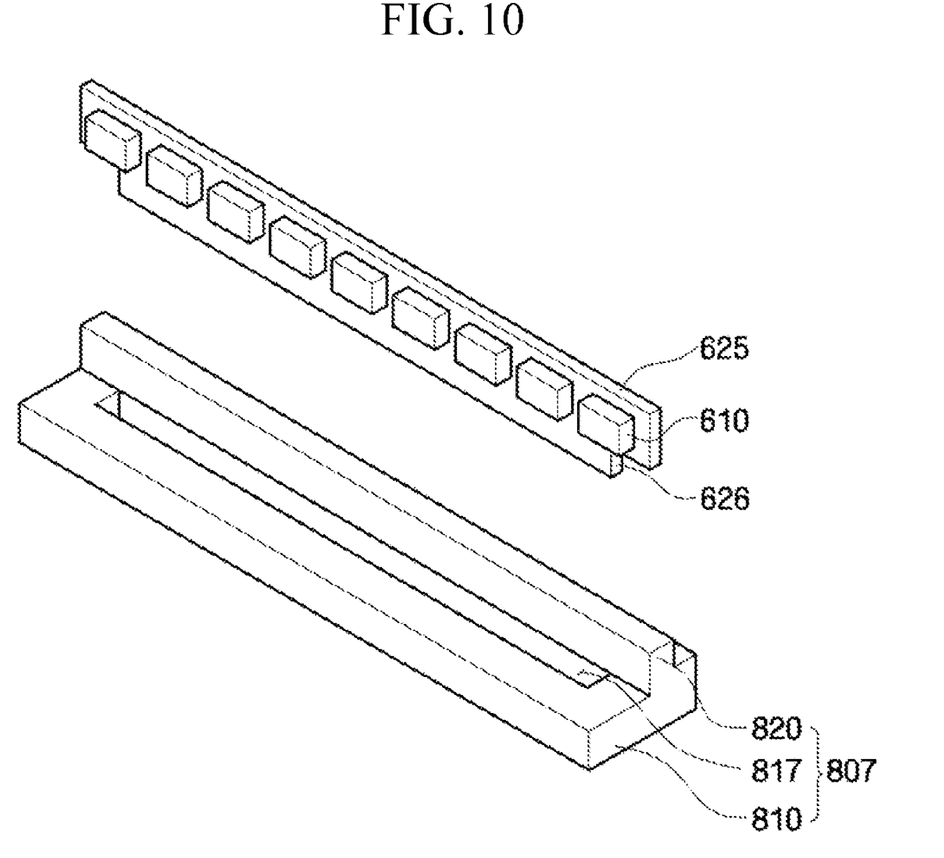
FIGS. 10 and 11 are perspective views of fixing members according to yet other exemplary embodiments.

FIG. 10 is a perspective view of an eighth fixing member 807 according to another exemplary embodiment. Referring to FIG. 10, the current embodiment is different from the embodiment of FIG. 2 in that an insertion groove 817 of the fixing member 807 is a slot formed in the middle of a base portion 810 along a long side of the base portion 810 but is not formed in both ends of the base portion 810. A length of a PCB 625 may be counter-slotted in equal shape and dimension to press-wise or otherwise fit into the slotted insertion groove 817. Alternatively, a protruding line 626 which is as long as the insertion groove 817 may be formed as shown in FIG. 10.

Figure 11:
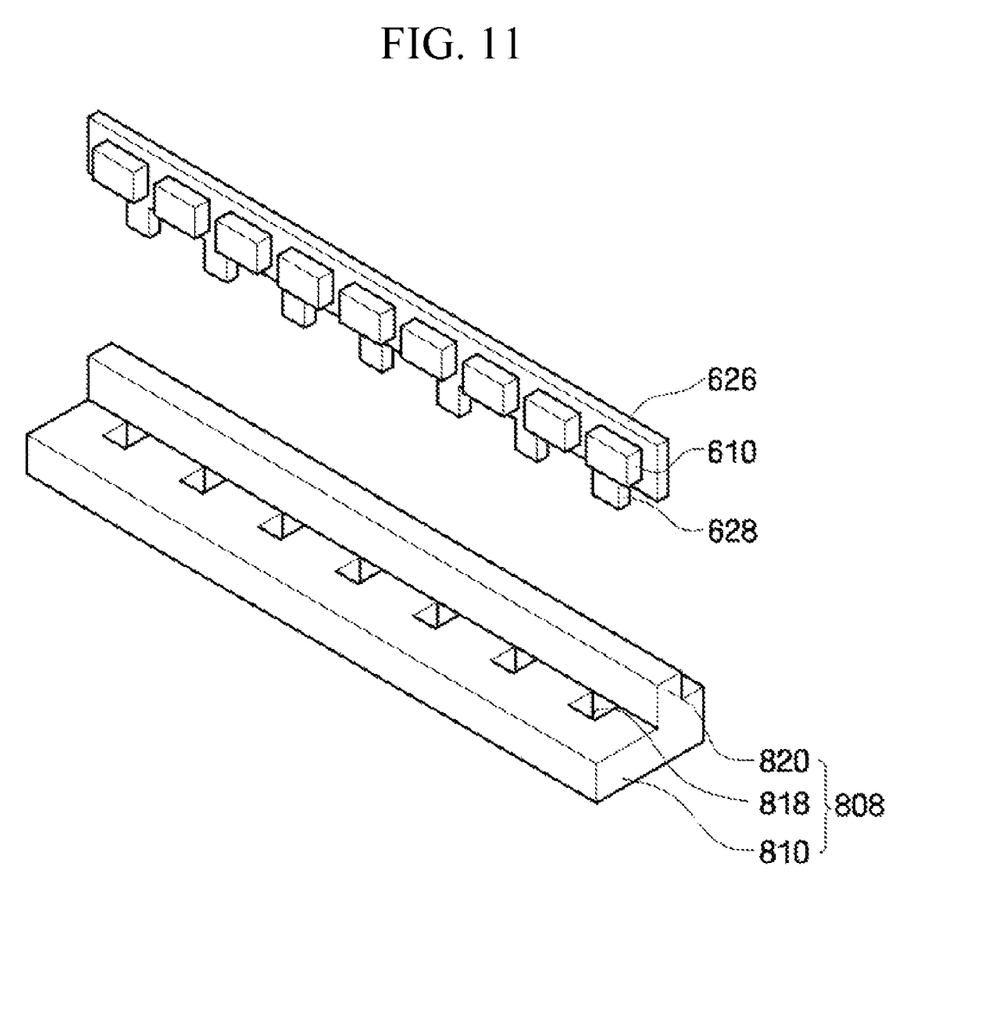

FIG. 11 is a perspective view of a fixing member 808 according to another exemplary embodiment. Referring to FIG. 11, the current embodiment is different from the embodiment of FIG. 2 in that the fixing member 808 includes a plurality of insertion slots or grooves 818 which are separated from each other. Accordingly, an end of a PCB 626 includes a plurality of protruding patterns 628 which can be inserted respectively into the insertion grooves 818.

Figure 12:
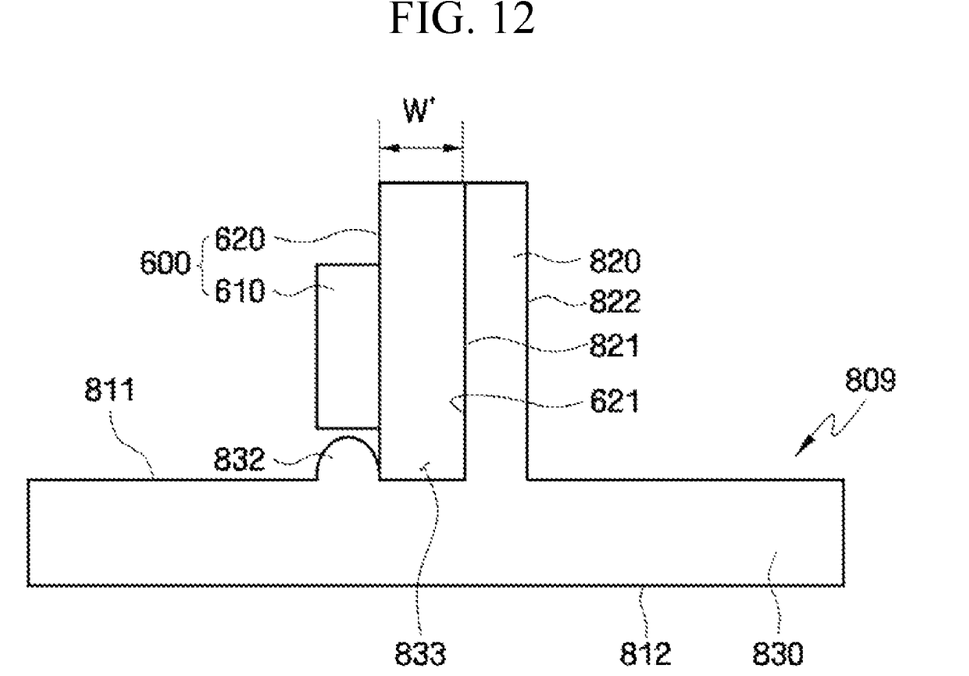
FIG. 12 is a cross-sectional view of a fixing member according to another exemplary embodiment.

FIG. 12 is a cross-sectional view of a fixing member 809 according to another exemplary embodiment. Referring to FIG. 12, the fixing member 809 according to the current exemplary embodiment includes a spacer or raised portion 832 as an insertion receiving structure, instead of an insertion groove. The raised portion 832 protrudes upward from a surface 811 of a base portion 830. Together with a support portion 820, the raised portion 832 defines an insertion space 833 for a PCB 620. The insertion space 833 may perform substantially the same function as the insertion groove 814 of FIG. 3.

The raised portion 832 may be continuously or discontinuously formed along the base portion 830.

The various embodiments described above can be combined with each other in various ways and applied accordingly.

While the present disclosure of invention has been particularly shown and described with reference to exemplary embodiments, it will be understood by those of ordinary skill in the art and in light of the foregoing that various changes in form and detail may be made therein without departing from the spirit and scope of the present teachings. The exemplary embodiments should be considered in a descriptive sense only and not for purposes of limitation.

What is claimed is:

1. A backlight unit configured to be part of a backlighted flat panel display device and to provide backlighting to the flat panel display device, the backlight unit comprising:
   one or more light-emitting diodes (LEDs) configured to emit backlighting source light in response to applied electrical power;
   a printed circuit board (PCB) on which the LEDs are mounted, the PCB having a first thermal transfer material arranged for transferring heat energy away from the LEDs;
   a PCB fixing member configured to fix the PCB into place, the PCB fixing member having a base portion and a support portion extending upward from a surface of the base portion; and
   a lower housing which houses the PCB and the PCB fixing member,
   wherein the PCB fixing member comprises a second thermal transfer material arranged to thermally couple with the first thermal transfer material and thereby maintain the transfer of heat energy away from the LEDs,
   wherein the PCB fixing member has defined therein an insertion receiving structure which is shaped and dimensioned for having at least part of the PCB inserted into the insertion receiving structure and for thereby providing thermal coupling between the first and second thermal transfer materials,
   wherein the insertion receiving structure comprises an insertion groove which is formed in the base portion,
   wherein the lower housing disposed under the PCB fixing member includes a hole which is connected to the insertion groove, and
   wherein the one end of the printed circuit board is inserted into the insertion groove and into the hole to a depth equal to that of a lower surface of the lower housing.

2. The backlight unit of claim 1, wherein the insertion receiving structure comprises an insertion groove which is formed in the base portion, the insertion groove being shaped and dimensioned to snuggly receive a corresponding portion of the PCB.

3. The backlight unit of claim 2, wherein the PCB inserted into the insertion groove is securely attached and thermally coupled to a surface of the support portion.

4. The backlight unit of claim 3, wherein at least one of inner surfaces of the insertion groove is located in a same plane as a surface of the support portion that contacts the PCB.

5. The backlight unit of claim 2, wherein the fixing member comprises a cover portion which extends from an end of the support portion toward the PCB inserted into the insertion groove.

6. The backlight unit of claim 5, further comprising a pressurizing member which is disposed to resiliently urge the PCB into the insertion groove.

7. The backlight unit of claim 6, wherein the pressurizing member comprises at least one of a spring, a leaf spring, a rubber, a sponge, and a plastic which has elasticity.

8. The backlight unit of claim 5, wherein the pressurizing member and the cover portion are formed as a single body, and the pressurizing member bends and extends from the cover portion.

9. The backlight unit of claim 2, wherein the insertion groove is continuously or discontinuously formed along the surface of the base portion.

10. The backlight unit of claim 2, wherein the insertion groove has an open bottom area which defines an opening in a bottom surface of the base portion.

11. The backlight unit of claim 10, wherein the lower housing comprises a housing groove which corresponds to the open bottom area of the insertion groove, and the PCB extends through the open bottom area of the insertion groove and continues its extension therethrough so as enter into and so as to be fixed to the housing groove.

12. The backlight unit of claim 2, further comprising a protrusion which protrudes from the lower surface of the cover portion toward the base portion, wherein the protrusion, the cover portion, and the support portion provide a housing space for the PCB.

13. The backlight unit of claim 1, wherein the insertion receiving structure comprises a raised portion which protrudes upward from the surface of the base portion and defines an insertion spacer for the PCB together with the support portion.

14. The backlight unit of claim 13, wherein the raised portion is discontinuously formed as spaced apart sections along the surface of the base portion.

15. The backlight unit of claim 1, wherein the PCB fixing member is made of a metal material with relatively good thermal conductivity for thereby transferring heat energy away from the corresponding PCB fixed thereby.

16. The backlight unit of claim 15, wherein the fixing member includes an extruded metal part.

17. The backlight unit of claim 1, further comprising a screw which penetrates the PCB and the fixing member.

18. The backlight unit of claim 1, wherein the base portion of the PCB fixing member contacts the lower housing.

19. The backlight unit of claim 18, wherein the printed circuit board (PCB) also contacts the lower housing.

\* \* \* \* \*